(12) United States Patent
Fu et al.

(10) Patent No.: US 10,903,135 B2
(45) Date of Patent: Jan. 26, 2021

(54) CHIP PACKAGE STRUCTURE AND MANUFACTURING METHOD THEREOF

(71) Applicant: Huawei Technologies Co., Ltd., Shenzhen (CN)

(72) Inventors: HuiLi Fu, Shenzhen (CN); Shujie Cai, Shenzhen (CN); Xiao Hu, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/855,752

(22) Filed: Dec. 27, 2017

(65) Prior Publication Data

US 2018/0190569 A1    Jul. 5, 2018

(30) Foreign Application Priority Data

Dec. 30, 2016    (CN) .......................... 2016 1 1258231

(51) Int. Cl.
*H01L 23/373* (2006.01)
*H01L 25/00* (2006.01)
(Continued)

(52) U.S. Cl.
CPC ...... *H01L 23/3735* (2013.01); *H01L 21/4853* (2013.01); *H01L 21/4871* (2013.01);
(Continued)

(58) Field of Classification Search
CPC . H01L 23/3735; H01L 25/50; H01L 25/0655; H01L 23/3135;
(Continued)

(56) References Cited

U.S. PATENT DOCUMENTS 7,094,459 B2 *   8/2006   Takahashi ........... H01L 23/3733
                                                    257/E23.112
8,421,217 B2     4/2013   Casey et al.
(Continued)

FOREIGN PATENT DOCUMENTS

CN    101174598 A    5/2008
CN    102208373 A    10/2011
(Continued)

OTHER PUBLICATIONS

Machine Translation and Abstract of International Publication No. WO2014045671, Mar. 27, 2014, 36 pages.
(Continued)

*Primary Examiner* — Ermias T Woldegeorgis
(74) *Attorney, Agent, or Firm* — Conley Rose, P.C.

(57) ABSTRACT

A chip package structure, including a substrate, multiple chips and multiple discrete devices that are packaged on an upper surface of the substrate, and a heat dissipation apparatus, where the heat dissipation apparatus includes an insulation layer and a thermally conductive layer that are laminated. The insulation layer completely encloses and adheres to outer surfaces of the multiple chips, outer surfaces of the multiple discrete devices, and the upper surface of the substrate and configured to conduct heat generated by the multiple chips and the multiple discrete devices to the thermally conductive layer and the substrate such that the heat generated by the multiple chips and the multiple discrete devices dissipated using the thermally conductive layer and the substrate.

16 Claims, 6 Drawing Sheets

(51) Int. Cl.
  *H01L 25/065* (2006.01)
  *H01L 23/31* (2006.01)
  *H01L 21/48* (2006.01)
  *H01L 23/538* (2006.01)
  *H01L 23/00* (2006.01)

(52) U.S. Cl.
  CPC ........ *H01L 23/3135* (2013.01); *H01L 23/538* (2013.01); *H01L 24/16* (2013.01); *H01L 24/48* (2013.01); *H01L 25/0655* (2013.01); *H01L 25/50* (2013.01); *H01L 23/373* (2013.01); *H01L 2224/16225* (2013.01); *H01L 2224/48225* (2013.01); *H01L 2924/00014* (2013.01); *H01L 2924/15311* (2013.01); *H01L 2924/181* (2013.01); *H01L 2924/19105* (2013.01)

(58) Field of Classification Search
  CPC ..... H01L 2924/00014; H01L 2924/181; H01L 23/373; H01L 2924/15311; H01L 2224/16225; F28F 3/02; F28F 3/046; F28F 3/048
  See application file for complete search history.

(56) References Cited

U.S. PATENT DOCUMENTS

| | | | |
|---|---|---|---|
| 8,575,767 | B1 | 11/2013 | Zommer |
| 2001/0019181 | A1 | 9/2001 | Lee et al. |
| 2002/0050407 | A1 | 5/2002 | Sohn et al. |
| 2003/0129352 | A1 | 7/2003 | Takahashi |
| 2004/0140551 | A1* | 7/2004 | Usui ................ H01L 21/6835 257/700 |
| 2005/0039884 | A1* | 2/2005 | Pawlenko ............ F28F 3/02 165/80.4 |
| 2006/0158804 | A1* | 7/2006 | Usui .................... H01L 21/568 361/58 |
| 2008/0094815 | A1 | 4/2008 | Kakuta et al. |
| 2013/0119530 | A1 | 5/2013 | Liu et al. |
| 2015/0115432 | A1 | 4/2015 | Argento |
| 2015/0187674 | A1 | 7/2015 | Miyanagi |
| 2016/0005682 | A1 | 1/2016 | Leal et al. |
| 2016/0351481 | A1 | 12/2016 | Kawakita et al. |

FOREIGN PATENT DOCUMENTS

| | | | |
|---|---|---|---|
| CN | 102371739 A | * | 3/2012 |
| CN | 102683302 A | | 9/2012 |
| CN | 102692000 A | | 9/2012 |
| CN | 103681543 A | | 3/2014 |
| CN | 104620373 A | | 5/2015 |
| CN | 105453253 A | | 3/2016 |
| CN | 106206486 A | | 12/2016 |
| CN | 106684057 A | | 5/2017 |
| JP | 2004104115 A | | 4/2004 |
| JP | 2015035567 A | | 2/2015 |
| KR | 20030057358 A | | 7/2003 |
| WO | 2014045671 A1 | | 3/2014 |

OTHER PUBLICATIONS

Foreign Communication From a Counterpart Application, European Application No. 17211035.5, Extended European Search Report dated May 7, 2018, 7 pages.
Machine Translation and Abstract of Chinese Publication No. CN105453253, Mar. 30, 2016, 26 pages.
Foreign Communication From a Counterpart Application, Chinese Application No. 201611258231.8, Chinese Office Action dated Jul. 11, 2018, 8 pages.
Machine Translation and Abstract of Chinese Publication No. CN102692000, Sep. 26, 2012, 10 pages.
Machine Translation and Abstract of Chinese Publication No. CN106684057, May 17, 2017, 17 pages.
Foreign Communication From a Counterpart Application, PCT Application No. PCT/CN2017/113385, International Search Report dated Feb. 5, 2018, 8 pages.
Foreign Communication From a Counterpart Application, PCT Application No. PCT/CN2017/113385, Written Opinion dated Feb. 5, 2018, 5 pages.
Machine Translation and Abstract of Chinese Publication No. CN102208373, Oct. 5, 2011, 7 pages.
Machine Translation and Abstract of Chinese Publication No. CN102683302, Sep. 19, 2012, 12 pages.
Machine Translation and Abstract of Japanese Publication No. JP2004104115, Apr. 2, 2004, 47 pages.
Machine Translation and Abstract of Japanese Publication No. JP2015035567, Feb. 19, 2015, 32 pages.
Foreign Communication From a Counterpart Application, Korean Application No. 10-2017-0183330, Korean Notice of Preliminary Rejection dated Jun. 20, 2019, 9 pages.

* cited by examiner

CHIP PACKAGE STRUCTURE AND MANUFACTURING METHOD THEREOF

CROSS-REFERENCE TO RELATED APPLICATION

This application claims priority to Chinese Patent Application No. 201611258231.8 filed on Dec. 30, 2016, which is hereby incorporated by reference in its entirety.

TECHNICAL FIELD

The present disclosure relates to the field of chip packaging technologies, and in particular, to a chip package structure and a manufacturing method thereof.

BACKGROUND

As a chip process node increasingly drops, chip integration is increasingly improved. A small size, a high rate, and high performance have become a development trend of an electronic component. An increasing quantity of transistors per unit area in a chip leads to an increasingly high power density and increasingly challenging thermal management on the chip. In a system-level chip package (such as System-in-Package (SiP)) structure, multiple heterogeneous chips and discrete devices are packaged and integrated into a small-size system. Because different chips have different power consumption in different operating states, a problem such as heat accumulation or uneven heat dissipation easily occurs in a SiP structure. At present, a commonly used technology for improving a heat dissipation capability of the chip is to add a heat dissipation apparatus, such as a metal heat sink or a thermo electric cooler (TEC), on a passive surface of the chip using a thermal interface material (TIM). Heat generated by the chip is finally transferred to the air. However, for a system-level chip package, this heat dissipation manner cannot achieve rapid and even heat dissipation of the multiple heterogeneous chips and discrete devices, and therefore is not conducive to improving heat dissipation efficiency for the system-level chip package.

SUMMARY

Embodiments of the present disclosure provide a chip package structure and a manufacturing method thereof, and a terminal using the system-level chip package structure in order to implement rapid and even heat dissipation for multiple chips and multiple discrete devices in a system-level chip package, and improve heat dissipation efficiency for the system-level chip package structure and the terminal.

A first aspect of the embodiments of the present disclosure provides a chip package structure, including a substrate, multiple chips and multiple discrete devices that are packaged on an upper surface of the substrate, and a heat dissipation apparatus, where the heat dissipation apparatus includes an insulation layer and a thermally conductive layer that are laminated, and the insulation layer completely encloses and adheres to outer surfaces of the multiple chips, outer surfaces of the multiple discrete devices, and the upper surface of the substrate and configured to conduct heat generated by the multiple chips and the multiple discrete devices to the thermally conductive layer and the substrate such that the heat generated by the multiple chips and the multiple discrete devices is dissipated using the thermally conductive layer and the substrate.

In the chip package structure, the heat dissipation apparatus including the insulation layer and the thermally conductive layer that are laminated is disposed, and the insulation layer completely encloses the multiple chips and multiple discrete devices in the chip package and the upper surface of the substrate in order to effectively increase a heat dissipation area, and implement even and rapid heat dissipation for the multiple chips and the multiple discrete devices.

In an implementation, the insulation layer and the thermally conductive layer that are laminated coincide in a projection direction perpendicular to the upper surface of the substrate.

In an implementation, the insulation layer is further configured to conduct the heat generated by the multiple chips and the multiple discrete devices to the air such that the heat generated by the multiple chips and the multiple discrete devices is directly dissipated using the insulation layer.

Because the insulation layer is in direct contact with the air at an edge position close to the substrate, the heat generated by the multiple chips and the multiple discrete devices may be further directly dissipated using the insulation layer in order to further improve a heat dissipation speed.

In an implementation, the insulation layer is made of a formable insulating material.

The insulation layer made of the formable insulating material is used. Therefore, when the heat dissipation apparatus is being cured to a system-level chip package, the insulation layer can closely adhere to the outer surfaces of the multiple chips, the outer surfaces of the multiple discrete devices, and the upper surface of the substrate in a manner such as thermo compression in order to effectively increase a heat dissipation area, and implement rapid heat dissipation for the multiple chips and the multiple discrete devices.

In an implementation, the thermally conductive layer is made of a thermally conductive material and a formable insulating material.

In an implementation, the thermally conductive material is evenly doped with the formable insulating material.

The thermally conductive material is evenly doped with the formable insulating material to form the thermally conductive layer. The thermally conductive layer can also have good formability by means of formability of the insulating material. The evenly doped thermally conductive material is used to ensure that all areas of the thermally conductive layer have even thermal conductivity in order to implement even heat dissipation for the multiple chips and the multiple discrete devices.

In an implementation, the thermally conductive material includes one or more of graphene, a graphite sheet, or a boron nitride sheet.

In an implementation, the formable insulating material includes at least one of an epoxy resin or a polyimide.

The grapheme, the graphite sheet, or the boron nitride sheet is evenly doped with the epoxy resin or the polyimide in different proportions to form the thermally conductive layer. Further, good thermal conduction efficiency can be ensured, and a heat dissipation speed can be improved. Further, it can be ensured that the thermally conductive layer has good formability. Therefore, when the heat dissipation apparatus is being cured to a system-level chip package, the thermally conductive layer can change with shape changes of the outer surfaces of the multiple chips, the outer surfaces of the multiple discrete devices, and the upper surface of the substrate in a manner such as thermo compression in order to further increase a heat dissipation area, and improve heat dissipation efficiency for an entire system-level chip package.

In an implementation, the chip includes any one of a wire bonding chip or a flip chip.

In an implementation, the chip package structure further includes multiple solder balls, and the multiple solder balls are disposed in an array on a lower surface of the substrate.

A second aspect of the embodiments of the present disclosure provides a method for manufacturing a chip package structure, including providing a substrate, and packaging multiple chips and multiple discrete devices on an upper surface of the substrate, providing a heat dissipation apparatus, where the heat dissipation apparatus includes an insulation layer and a thermally conductive layer, and laminating the heat dissipation apparatus to the upper surface of the substrate such that the insulation layer completely encloses and adheres to outer surfaces of the multiple chips, outer surfaces of the multiple discrete devices, and the upper surface of the substrate.

In the method for manufacturing a chip package structure, the heat dissipation apparatus is laminated to the upper surface of the substrate such that the insulation layer completely encloses and adheres to the outer surfaces of the multiple chips, the outer surfaces of the multiple discrete devices, and the upper surface of the substrate in order to effectively increase a heat dissipation area, and implement even and rapid heat dissipation for the multiple chips and the multiple discrete devices.

In an implementation, laminating the heat dissipation apparatus to the upper surface of the substrate such that the insulation layer completely encloses and adheres to outer surfaces of the multiple chips, outer surfaces of the multiple discrete devices, and the upper surface of the substrate includes heating the insulation layer to a first temperature, and continuously laminating the insulation layer for a first time period at a first pressure until the insulation layer completely encloses and adheres to the outer surfaces of the multiple chips, the outer surfaces of the multiple discrete devices, and the upper surface of the substrate, heating the insulation layer to a second temperature, and keeping the second temperature for a second time period in order to cure the insulation layer, heating the thermally conductive layer to a third temperature, and continuously laminating the thermally conductive layer for a third time period at a second pressure to an upper surface of the insulation layer, heating the thermally conductive layer to a fourth temperature, and keeping the fourth temperature for a fourth time period in order to cure the thermally conductive layer.

In an implementation, laminating the heat dissipation apparatus to the upper surface of the substrate such that the insulation layer completely encloses and adheres to outer surfaces of the multiple chips, outer surfaces of the multiple discrete devices, and the upper surface of the substrate includes laminating the thermally conductive layer to the insulation layer to form, as the heat dissipation apparatus, the insulation layer and the thermally conductive layer that are laminated, keeping the insulation layer facing the upper surface of the substrate, heating the heat dissipation apparatus to a first temperature, and continuously laminating the heat dissipation apparatus for a first time period at a first pressure until the insulation layer completely encloses and adheres to the outer surfaces of the multiple chips, the outer surfaces of the multiple discrete devices, and the upper surface of the substrate, and heating the heat dissipation apparatus to a second temperature, and keeping the second temperature for a second time period in order to cure the heat dissipation apparatus.

In an implementation, the first temperature and the third temperature are both 150 degrees, the second temperature and the fourth temperature are both 175 degrees, the first pressure and the second pressure are both 7-10 kilogram-force per centimeter square ($kgf/cm^2$), the first time period and the third time period are both 30 seconds, and the second time period and the fourth time period are both one hour.

A fourth aspect of the embodiments of the present disclosure provides a terminal, including a chip package structure and a mainboard, where a pad is disposed on the mainboard, the chip package structure is welded to the pad, the chip package structure includes a substrate, multiple chips and multiple discrete devices that are packaged on an upper surface of the substrate, and a heat dissipation apparatus, the heat dissipation apparatus includes an insulation layer and a thermally conductive layer that are laminated, and the insulation layer completely encloses and adheres to outer surfaces of the multiple chips, outer surfaces of the multiple discrete devices, and the upper surface of the substrate and configured to conduct heat generated by the multiple chips and the multiple discrete devices to the thermally conductive layer and the substrate such that the heat generated by the multiple chips and the multiple discrete devices is dissipated using the thermally conductive layer and the substrate.

In the chip package structure, the heat dissipation apparatus including the insulation layer and the thermally conductive layer is disposed on the upper surface of the substrate. The insulation layer closely adheres to the outer surfaces of the multiple chips, the outer surfaces of the multiple discrete devices, and the upper surface of the substrate using a thereto compression process in order to effectively increase a heat dissipation area, improve heat dissipation evenness, implement rapid and efficient heat dissipation for the multiple chips and the multiple discrete devices, and improve heat dissipation efficiency of the terminal.

BRIEF DESCRIPTION OF DRAWINGS

To describe the technical solutions in the embodiments of the present disclosure more clearly, the following briefly describes the accompanying drawings required for describing the embodiments of the present disclosure.

DESCRIPTION OF EMBODIMENTS

The following describes the embodiments of the present disclosure with reference to the accompanying drawings.

Figure 1:
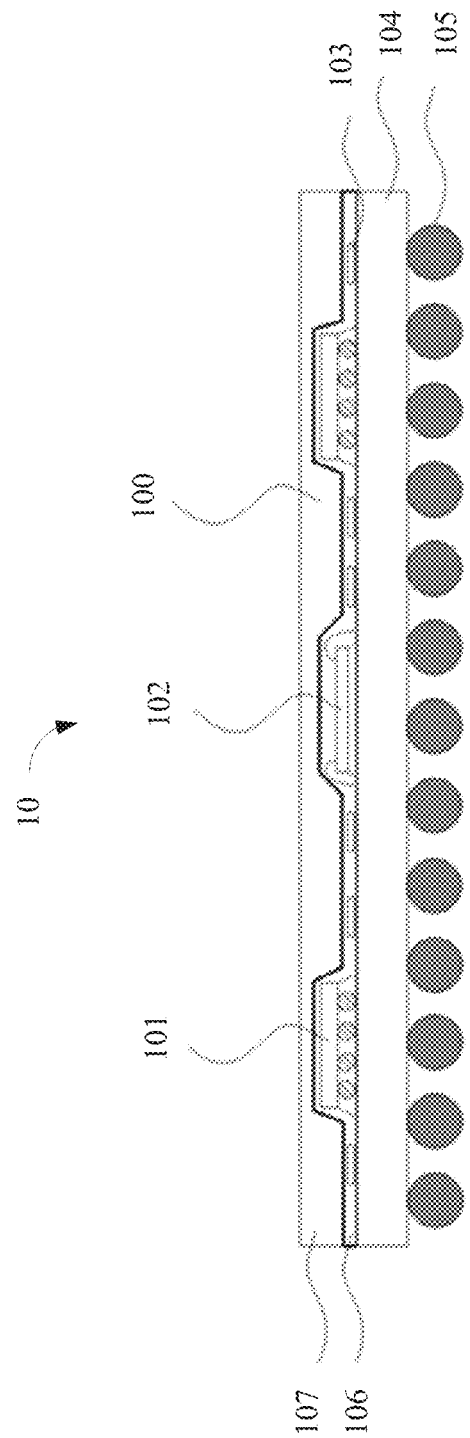
FIG. 1 is a schematic sectional view of a system-level chip package structure according to an embodiment of the present disclosure.

Referring to FIG. 1, an embodiment of the present disclosure provides a system-level chip package structure 10, including a substrate 104. Multiple chips 101 and 102 and multiple discrete devices 103 are packaged on an upper surface of the substrate 104. Multiple solder balls 105 are disposed on a lower surface of the substrate 104. In this embodiment, the chip 101 is packaged on the upper surface of the substrate 104 in a flip chip manner. The chip 102 is packaged on the upper surface of the substrate 104 in a wire bonding manner. The multiple discrete devices 103 are packaged on the upper surface of the substrate 104 in a surface-mount manner. It may be understood that when the system-level chip package structure 10 is operating, the multiple chips 101 and 102 and the multiple discrete devices 103 are heat sources. To allow an operating temperature of the system-level chip package structure 10 to be within a rated temperature range, heat generated by the multiple chips 101 and 102 and the multiple discrete devices 103 needs to be evenly and rapidly dissipated in order to ensure stable operation of the system-level chip package structure 10. It may be understood that types of the chips 101 and 102 include but are not limited to a wire bonding chip and a flip chip, and the multiple discrete devices 103 include but are not limited to a capacitor and an inductor.

The system-level chip package structure 10 further includes a heat dissipation apparatus 100. The heat dissipation apparatus 100 includes an insulation layer 106 and a thermally conductive layer 107 that are laminated. The insulation layer 106 completely encloses and adheres to outer surfaces of the multiple chips 101 and 102, outer surfaces of the multiple discrete devices 103, and the upper surface of the substrate 104 and configured to conduct the heat generated by the multiple chips 101 and 102 and the multiple discrete devices 103 to the thermally conductive layer 107 and the substrate 104 such that the heat generated by the multiple chips 101 and 102 and the multiple discrete devices 103 dissipated using the thermally conductive layer 107 and the substrate 104. The lamination means that two or more layers of a same material or different materials are combined as a whole by means of heating and pressing with or without use of a binder. In this embodiment, the insulation layer 106 and the thermally conductive layer 107 are combined as a whole under the action of heat and pressure. In this embodiment, the insulation layer 106 and the thermally conductive layer 107 that are laminated coincide in a projection direction perpendicular to the upper surface of the substrate 104.

It may be understood that the insulation layer 106 is further configured to conduct the heat generated by the multiple chips 101 and 102 and the multiple discrete devices 103 to the air such that the heat generated by the multiple chips 101 and 102 and the multiple discrete devices 103 is directly dissipated using the insulation layer 106. The insulation layer 106 has good formability and specific thermal conductivity. Therefore, the heat dissipation apparatus 100 can be cured to the substrate 104 in a thereto compression manner, and the insulation layer 106 can closely adhere to the outer surfaces of the multiple chips 101 and 102, the outer surfaces of the multiple discrete devices 103, and the upper surface of the substrate 104 in order to effectively increase a heat dissipation area, and implement rapid heat dissipation for the multiple chips 101 and 102 and the multiple discrete devices 103. In this embodiment, the insulation layer 106 is made of a formable insulating material, including but not limited to, for example, an epoxy resin or a polyimide. The thermally conductive layer 107 is made of graphene, a graphite sheet, or a boron nitride sheet doped with an epoxy resin or a polyimide in different proportions. It may be understood that the thermally conductive layer 107 is not limited to being made of the graphene, the graphite sheet, or the boron nitride sheet doped with the epoxy resin or the polyimide, and may be alternatively made of another thermally conductive material that has similar performance to the graphene, the graphite sheet, or the boron nitride sheet and is evenly doped in a specific proportion with another formable insulating material that has similar performance to the epoxy resin or the polyimide.

In an implementation, the heat dissipation apparatus 100 may include multiple insulation layers 106 and multiple thermally conductive layers 107. The multiple insulation layers 106 and the multiple thermally conductive layers 107 are alternately laminated. When the heat dissipation apparatus 100 includes multiple insulation layers 106 and multiple thermally conductive layers 107, a bottom layer is an insulation layer 106 configured to completely enclose the outer surfaces of the multiple chips 101 and 102, the outer surfaces of the multiple discrete devices 103, and the upper surface of the substrate 104, a top layer is a thermally conductive layer 107 configured to conduct the heat generated by the multiple chips 101 and 102 and the multiple discrete devices 103 to the air. It may be understood that different insulation layers 106 and different thermally conductive layers 107 may have different thermal conductivity coefficients and different electrical conductivity coefficients.

Figure 2:
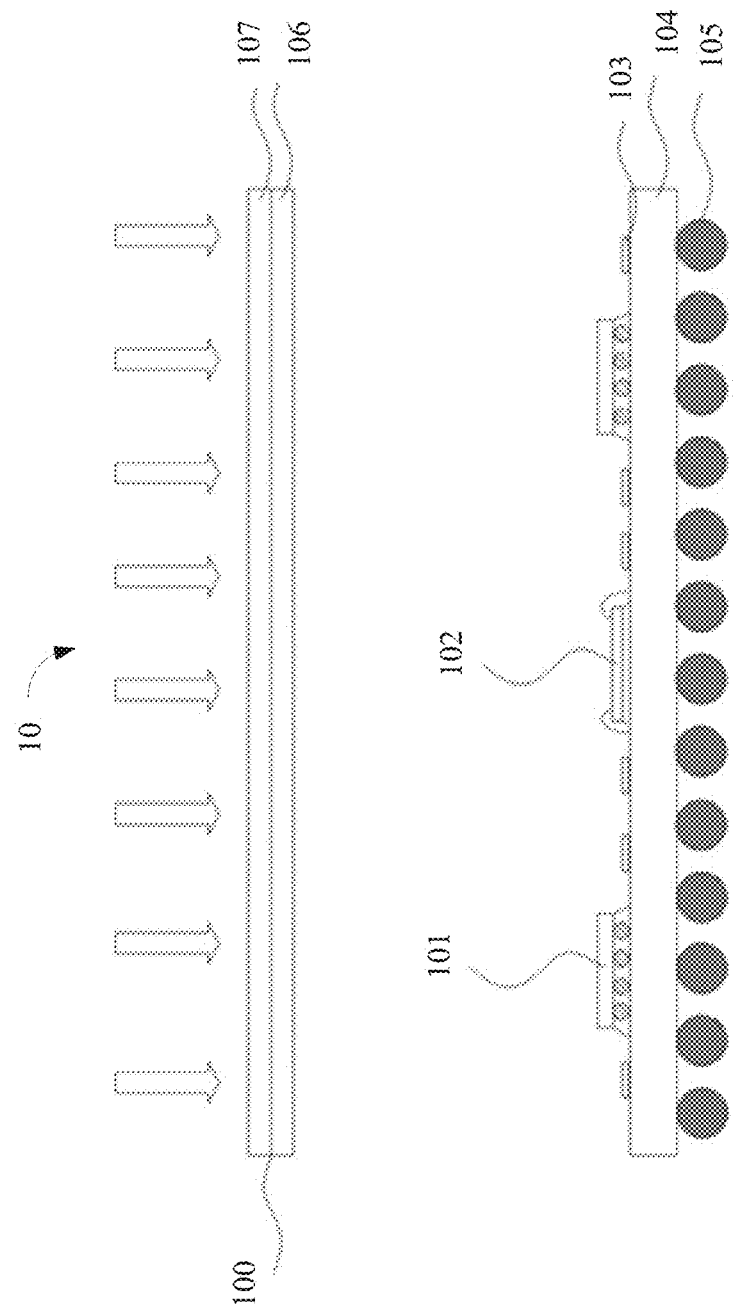
FIG. 2 is a schematic disassembly view of a system-level chip package structure according to an embodiment of the present disclosure.

Referring to FIG. 2, which is based on FIG. 1, when the system-level chip package structure 10 is being manufactured, the corresponding chips 101 and 102 and discrete devices 103 may be first packaged on the upper surface of the substrate 104, and then the heat dissipation apparatus 100 is cured to the upper surface of the substrate 104 in the thermo compression manner. Further, the insulation layer 106 and the thermally conductive layer 107 may be laminated together in advance to form the heat dissipation apparatus 100, and the heat dissipation apparatus 100 is further cured to the upper surface of the substrate 104 in the thermo compression manner with the insulation layer 106 facing the upper surface of the substrate 104, as shown in FIG. 2. Alternatively, the insulation layer 106 may be first cured to the upper surface of the substrate 104 in the thermo compression manner, and then the thermally conductive layer 107 is cured to an upper surface of the insulation layer 106 in the thermo compression manner, it may be understood that a process condition for curing the heat dissipation apparatus 100 to the upper surface of the substrate 104 may include but is not limited to a temperature condition and a pressure condition.

Figure 3:
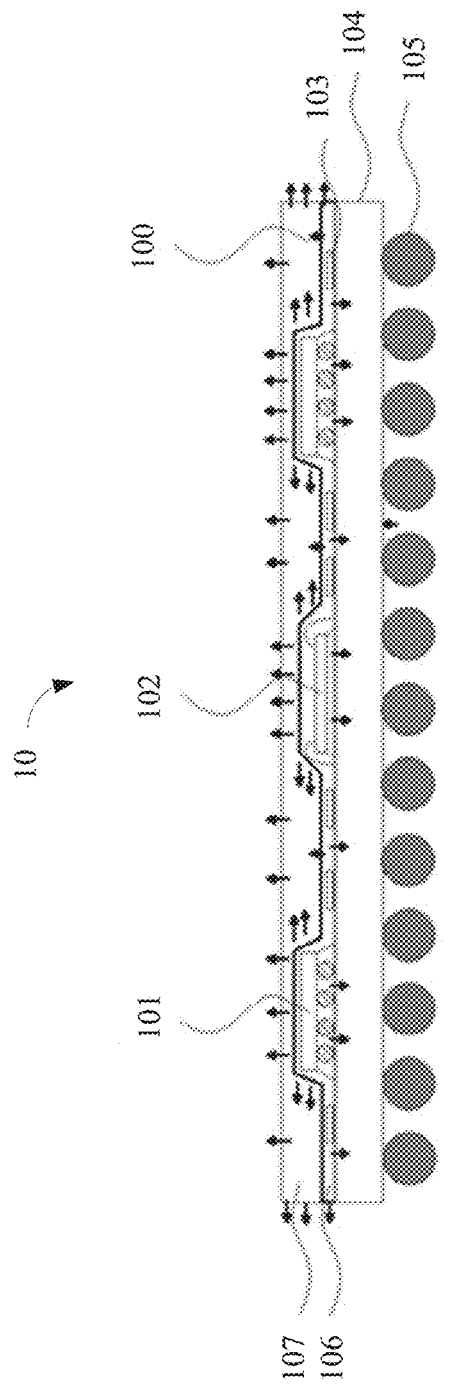
FIG. 3 is a schematic diagram of a heat dissipation path of a system-level chip package structure according to an embodiment of the present disclosure.

Referring to FIG. 3, which is based on FIG. 1, the insulation layer 106 of the heat dissipation apparatus 100 completely encloses the outer surfaces of the multiple chips 101 and 102, the outer surfaces of the multiple discrete devices 103, and the upper surface of the substrate 104 in order to form an omnidirectional heat dissipation path around the multiple chips 101 and 102 and the multiple discrete devices 103, and implement even and efficient heat dissipation for the multiple chips 101 and 102 and the multiple discrete devices 103. Further, a heat dissipation path of the system-level chip package structure 10 is indicated by arrows in FIG. 3. Because the insulation layer 106 is in close contact with the upper surface of the substrate 104 and the thermally conductive layer 107, the heat generated by the multiple chips 101 and 102 and the multiple discrete devices 103 may be conducted to the substrate 104 using the insulation layer 106, and the heat is further dissipated to the air using the substrate 104. Further, the heat may be conducted to the thermally conductive layer 107 using the insulation layer 106, and the heat is further dissipated to the air using the thermally conductive layer 107. In addition, heat at an edge position near the substrate 104 may be directly conducted to the air using the insulation layer 106 to implement heat dissipation. Because the insulation layer 106 is in close contact with all chips 101 and 102 and all discrete devices 103, the heat generated by the chips 101 and 102 and the discrete devices 103 can be more evenly conducted to the thermally conductive layer 107 and the substrate 104, and performance, of an entire system-level chip package structure 10 can be effectively prevented from being affected because of an excessively high temperature of an individual chip or discrete device.

Figure 4:
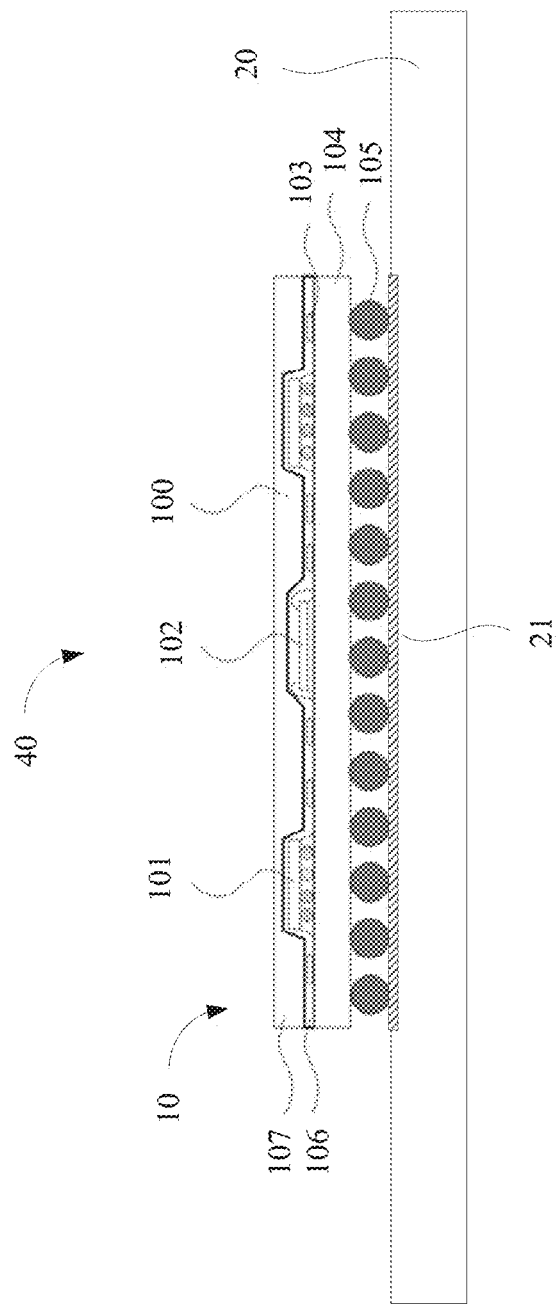
FIG. 4 is a schematic structural diagram of a terminal using a system-level chip package structure according to an embodiment of the present disclosure.

Referring to FIG. 4, an embodiment of the present disclosure provides a terminal 40, including a system-level chip package structure 10 and a mainboard 20. A pad 21 is disposed on the mainboard 20, and the system-level chip package structure 10 is welded to the pad 21 using the solder balls 105 in order to implement an electrical connection with the mainboard 20. The system-level chip package structure 10 is the system-level chip package structure 10 in the embodiment shown in FIG. 1 to FIG. 3. For details, refer to the related description in the embodiment shown in FIG. 1 to FIG. 3. Details are not described herein again. It may be understood that the system-level chip package structure 10 includes a heat dissipation apparatus 100 in order to implement even and efficient heat dissipation for chips 101 and 102 and discrete devices 103 in the system-level chip package structure 10, improve heat dissipation performance of the terminal 40, and ensure operation stability of the terminal 40. The terminal 40 may be, but is not limited to, a mobile phone, a tablet computer, a smartwatch, or the like.

Figure 5:
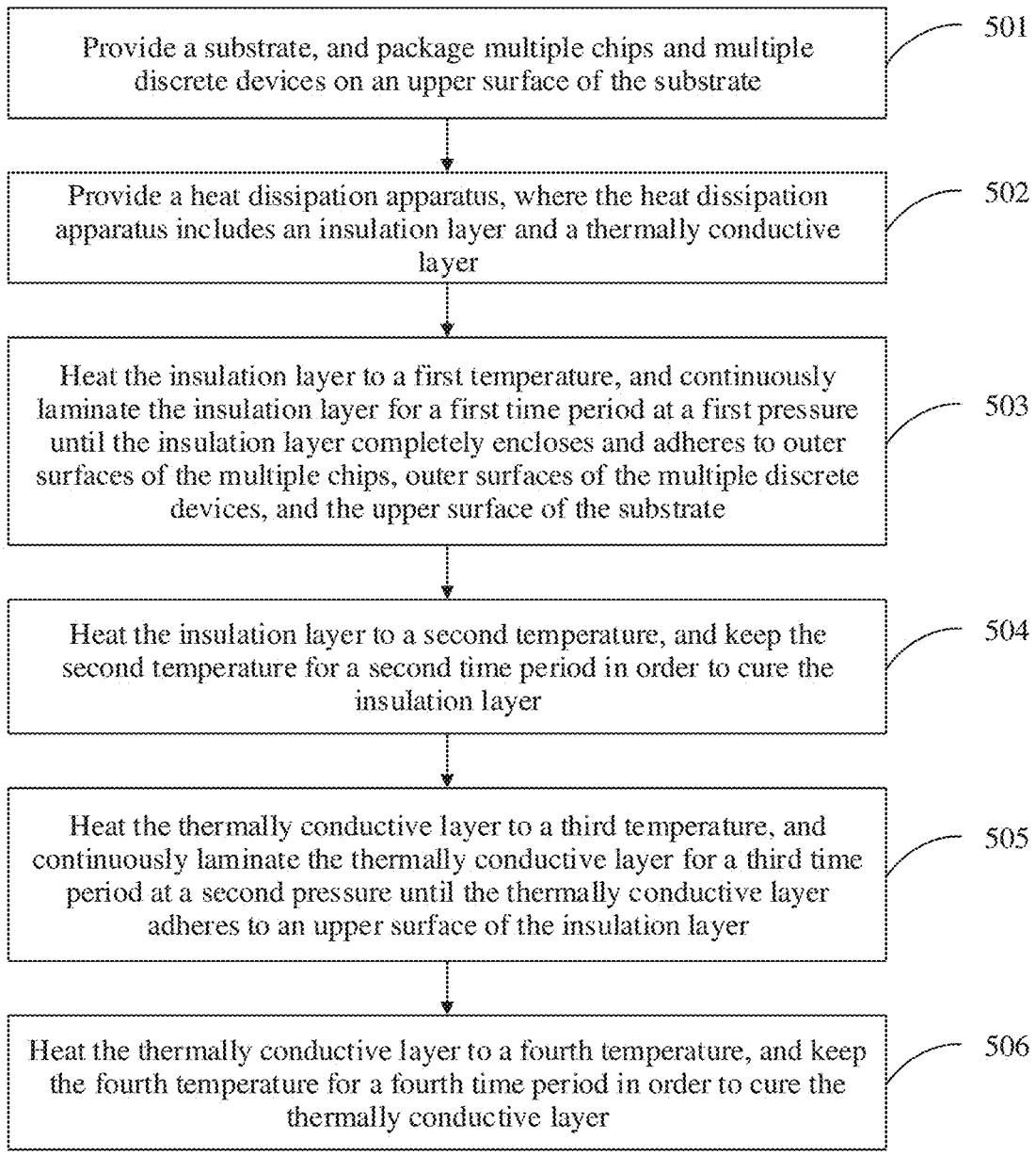
FIG. 5 is a schematic flowchart of a method for manufacturing a system-level chip package structure according to an embodiment of the present disclosure.

Referring to FIG. 5, an embodiment of the present disclosure provides a method for manufacturing a system-level chip package structure, including the following steps.

Step 501: Provide a substrate, and package multiple chips and multiple discrete devices on an upper surface of the substrate.

Step 502: Provide a heat dissipation apparatus, where the heat dissipation apparatus includes an insulation layer and a thermally conductive layer.

Step 503: Heat the insulation layer to a first temperature, and continuously laminate the insulation layer for a first time period at a first pressure until the insulation layer completely encloses and adheres to outer surfaces of the multiple chips, outer surfaces of the multiple discrete devices, and the upper surface of the substrate.

Step 504: Heat the insulation layer to a second temperature, and keep the second temperature for a second time period in order to cure the insulation layer.

Step 505: Heat the thermally conductive layer to a third temperature, and continuously laminate the thermally conductive layer for a third time period at a second pressure until the thermally conductive layer adheres to an upper surface of the insulation layer.

Step 506: Heat the thermally conductive layer to a fourth temperature, and keep the fourth temperature for a fourth time period in order to cure the thermally conductive layer.

In this embodiment, the first temperature and the third temperature are both 150 degrees. The second temperature and the fourth temperature are both 175 degrees Celsius. The first pressure and the second pressure are both 7-10 kgf/cm$^2$. The first time period and the third time period are both 30 seconds. The second time period and the fourth time period are both one hour. It may be understood that a temperature condition, a pressure condition, and duration for laminating the insulation layer may be the same as or different from a temperature condition, a pressure condition, and duration for laminating the thermally conductive layer, and a temperature condition and duration for curing the insulation layer may be the same as or different from a temperature condition and duration for curing the thermally conductive layer. Selection may be performed according to different materials.

Figure 6:
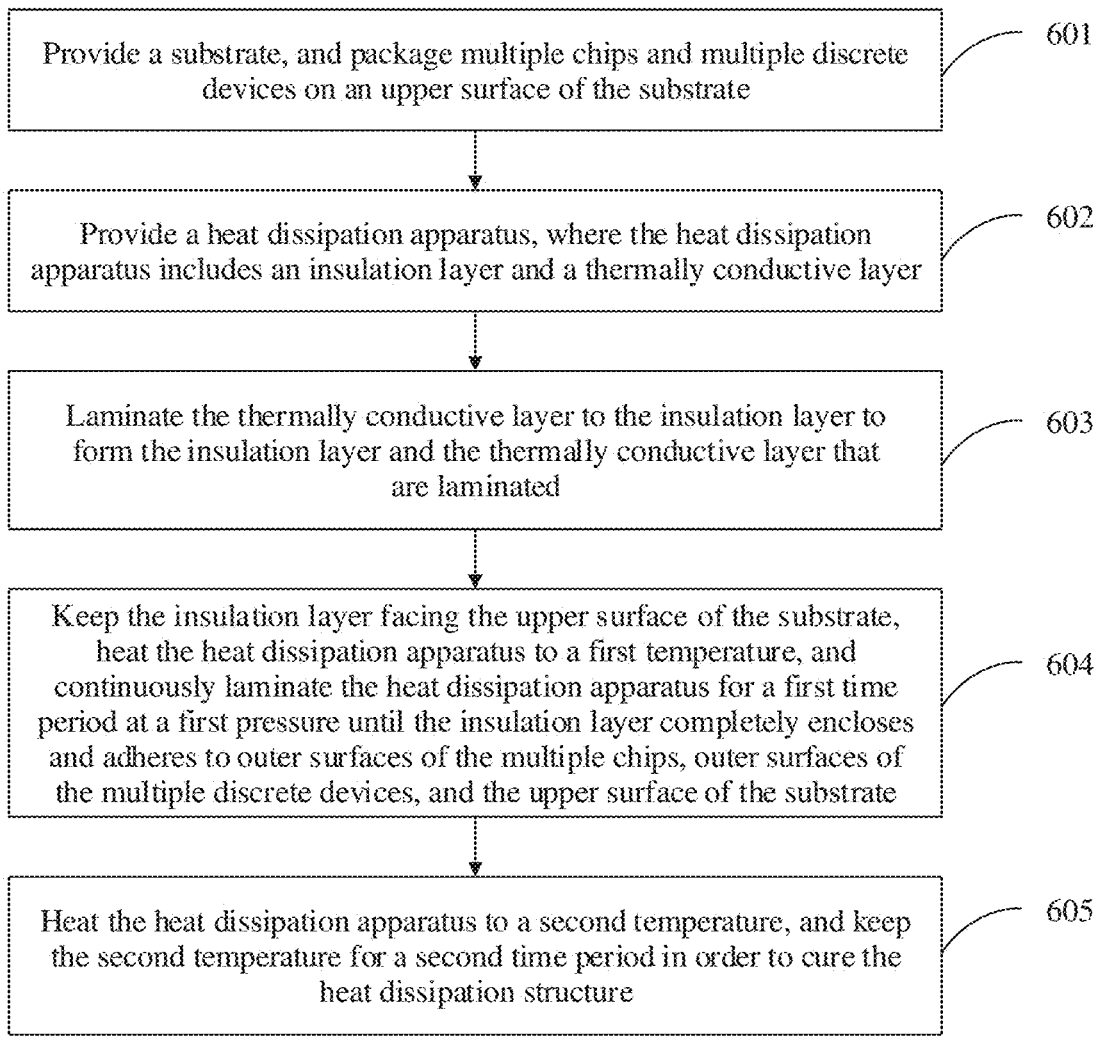
FIG. 6 is another schematic flowchart of a method for manufacturing a system-level chip package structure according to an embodiment of the present disclosure.

Referring to FIG. 6, an embodiment of the present disclosure provides a method for manufacturing a system-level chip package structure, including the following steps.

Step 601: Provide a substrate, and package multiple chips and multiple discrete devices on an upper surface of the substrate.

Step 602: Provide a heat dissipation apparatus, where the heat dissipation apparatus includes an insulation layer and a thermally conductive layer.

Step 603: Laminate the thermally conductive layer to the insulation layer to form the insulation layer and the thermally conductive layer that are laminated.

Step 604: Keep the insulation layer facing the upper surface of the substrate, heat the heat dissipation apparatus to a first temperature, and continuously laminate the heat dissipation apparatus for a first time period at a first pressure until the insulation layer completely encloses and adheres to outer surfaces of the multiple chips, outer surfaces of the multiple discrete devices, and the upper surface of the substrate.

Step 605: Heat the heat dissipation apparatus to a second temperature, and keep the second temperature for a second time period in order to cure the heat dissipation apparatus.

In this embodiment, in this embodiment, the first temperature is 150 degrees Celsius, the second temperature is 175 degrees Celsius, the first pressure is 7-10 kgf/cm$^2$, the first time period is 30 seconds, and the second time period is one hour.

It may be understood that process parameters used in each step in the method embodiments shown in FIG. 5 and FIG. 6 are merely example parameters, and are not intended to limit the protection scope of the present disclosure. The process parameters may be appropriately changed according to different materials used by the insulation layer and the thermally conductive layer.

In the system-level chip package structure 10, the heat dissipation apparatus 100 including the insulation layer 106 and the thermally conductive layer 107 is disposed on the upper surface of the substrate 104. The insulation layer 106 closely adheres to the outer surfaces of the multiple chips 101 and 102, the outer surfaces of the multiple discrete devices 103, and the upper surface of the substrate 104 using a thermo compression process in order to effectively increase a heat dissipation area, improve heat dissipation evenness, and implement rapid and efficient heat dissipation for the multiple chips 101 and 102 and the multiple discrete devices 103.

What is claimed is:

1. A chip package structure, comprising:
   a substrate;
   a chip and a discrete device that are packaged on an upper surface of the substrate; and
   a heat dissipation apparatus comprising a plurality of layers, wherein the plurality of layers comprises a plurality of insulation layers and a plurality of thermally conductive layers that are alternately laminated, wherein a lowest layer of the plurality of layers is an insulating layer that completely encloses outer surfaces of the chip, an outer surface of the discrete device, and the upper surface of the substrate, and wherein a highest layer of the plurality of layers is a thermally conductive layer.

2. The chip package structure of claim 1, wherein the plurality of thermally conductive layers comprises a thermally conductive material and a formable insulating material.

3. The chip package structure of claim 2, wherein the thermally conductive material is evenly doped with the formable insulating material.

4. The chip package structure of claim 2, wherein the thermally conductive material comprises graphene.

5. The chip package structure of claim 2, wherein the thermally conductive material comprises a graphite sheet.

6. The chip package structure of claim 2, wherein the thermally conductive material comprises a boron nitride sheet.

7. The chip package structure of claim 2, wherein the thermally conductive material comprises graphene and a boron nitride sheet.

8. The chip package structure of claim 2, wherein the thermally conductive material comprises a graphite sheet and a boron nitride sheet.

9. The chip package structure of claim 2, wherein the formable insulating material comprises an epoxy resin.

10. The chip package structure of claim 2, wherein the formable insulating material comprises a polyimide.

11. The chip package structure of claim 2, wherein the formable insulating material comprises an epoxy resin and a polyimide.

12. The chip package structure of claim 1, wherein the plurality of insulation layers and the plurality of thermally conductive layers that are laminated coincide in a projection direction that is perpendicular to the upper surface of the substrate.

13. The chip package structure of claim 1, wherein the plurality of insulation layers is configured to conduct the heat generated by the chip and the discrete device to air such that the heat generated by the chip and the discrete device are directly dissipated using the plurality of insulation layers.

14. The chip package structure of claim 1, wherein the plurality of insulation layers comprises a formable insulating material.

15. The chip package structure of claim 1, further comprising a plurality of solder balls disposed in an array on a lower surface of the substrate.

16. The chip package structure of claim 1, wherein an inner surface of a thermally conductive layer of the plurality of thermally conductive layers that contacts an insulation layer of the plurality of insulation layers is contorted about the outer surfaces of the chip, the outer surfaces of the discrete device, and the upper surface of the substrate, and wherein an outer surface of the highest layer that is away from the insulation layer is planar.

* * * * *

UNITED STATES PATENT AND TRADEMARK OFFICE
CERTIFICATE OF CORRECTION

PATENT NO. : 10,903,135 B2
APPLICATION NO. : 15/855752
DATED : January 26, 2021
INVENTOR(S) : HuiLi Fu et al.

It is certified that error appears in the above-identified patent and that said Letters Patent is hereby corrected as shown below:

On the Title Page

Item (54) and in the Specification, Column 1, Line 1, Title: "Chip Package structure and Manufacturing Method Thereof" should read "Chip Package Structure Having a Heat Dissipation Apparatus with Alternating Multiple Insulation and Thermally Conductive Layers"

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*